United States Patent [19]

Hansen

[11] Patent Number: 5,155,862
[45] Date of Patent: Oct. 13, 1992

[54] FM RECEIVER HAVING VARIABLE IF FILTER

[75] Inventor: Jens Hansen, Berlin, Fed. Rep. of Germany

[73] Assignee: H.U.C. Elektronik GmbH, Berlin, Fed. Rep. of Germany

[21] Appl. No.: 427,850

[22] PCT Filed: Apr. 15, 1988

[86] PCT No.: PCT/DE88/00236
§ 371 Date: Oct. 16, 1989
§ 102(e) Date: Oct. 16, 1989

[87] PCT Pub. No.: WO88/08223
PCT Pub. Date: Oct. 20, 1988

[30] Foreign Application Priority Data

Apr. 15, 1987 [DE] Fed. Rep. of Germany ....... 3712736
Jul. 24, 1987 [DE] Fed. Rep. of Germany ....... 3724604

[51] Int. Cl.$^5$ .............................................. H04B 1/06
[52] U.S. Cl. .................................... 455/266; 455/297; 455/182.1
[58] Field of Search ................ 455/226, 266, 295–297, 455/339, 340, 182, 183, 185, 192, 193, 316; 358/195.1

[56] References Cited

U.S. PATENT DOCUMENTS

| | | | |
|---|---|---|---|
| 4,081,771 | 3/1978 | Hendrickson | 455/182 |
| 4,352,208 | 9/1982 | Schroeder | 455/266 |
| 4,356,567 | 10/1982 | Eguchi et al. | 455/266 |
| 4,458,207 | 7/1984 | Favreau et al. | 455/266 |
| 4,525,868 | 6/1985 | Kage et al. | 455/295 |
| 4,531,148 | 7/1985 | Ohta et al. | 455/340 |
| 4,598,426 | 7/1986 | Shiojima | 455/340 |

FOREIGN PATENT DOCUMENTS

| | | |
|---|---|---|
| 0048661 | 3/1982 | European Pat. Off. . |
| 0075071 | 3/1983 | European Pat. Off. . |
| 3147493 | 6/1983 | Fed. Rep. of Germany . |
| 2497039 | 6/1982 | France . |
| 8602505 | 4/1986 | PCT Int'l Appl. . |
| 903107 | 8/1962 | United Kingdom . |

OTHER PUBLICATIONS

International Search Report, EPO, Jun. 5, 1988, 5 pages.

*Primary Examiner*—Curtis Kuntz
*Assistant Examiner*—Andrew Faile
*Attorney, Agent, or Firm*—Spencer & Frank

[57] ABSTRACT

In an FM receiver where the center frequency of an IF filter is varied depending on the received signal, an arrangement is described where the bandwidth of the variable IF filter is changed depending on reception quality of the received signal.

11 Claims, 3 Drawing Sheets

FM RECEIVER HAVING VARIABLE IF FILTER

BACKGROUND OF THE INVENTION

The invention relates to an FM receiver equipped with a variable IF filter.

Arrangements of this type are known from DE-OS 3,147,493 and DE-OS 3,438,286, EP-Al-75,071 or FR-OS 8,121,986, all of which originate from the inventor of the present invention.

In presently employed FM radio receivers, a broadband IF filter is provided. The center frequency $f_{IF}$ of such a broadband IF filter is 10.7 MHz in most standards while the channel bandwidth is about 200 kHz ($\pm 100$ kHz symmetrically with respect to the center frequency $f_{IF}$). The passband characteristic is selected in such a manner that its bandwidth corresponds approximately to the transmission bandwidth. Due to the wide bandwidth, a relatively large amount of interference and noise components of the antenna input signal are passed by the prior art IF filter, with the result that relatively high input field strengths are required to ensure a useful signal (modulation) worthy of being received.

To increase reception sensitivity, it is known from the above-mentioned references to use as an IF filter a filter which has a narrow bandwidth relative to the channel bandwidth. The center frequency of this narrow-band IF filter is retuned in dependence on the modulation of the received signal. At any arbitrary point in time, selection thus occurs exactly where the momentary IF happens to be located. This results in much improved suppression of interference and noise components. The bandwidth of this controlled IF filter, which is also referred to in the literature as an "in-channel-select" filter or, abbreviated, "ICS" filter, is about 20 kHz as a result of which, however, only the monophonic useful signal component (L+R component of the useful MPX signal) is passed.

For this reason, it is only possible to operate the ICS filter in parallel with a broadband IF filter in an FM stereo receiver and to effectively connect the ICS filter with the LF stage of the receiver if, in any case, only monophonic reproduction is possible due to a received signal which is too weak or has too much interference (for example, below 25 $\mu$V antenna input voltage).

SUMMARY OF THE INVENTION

In contrast thereto, the invention has the object of achieving, in a filter arrangement of the type mentioned above, filtering of the entire signal with adequate sensitivity without greatly increased engineering expenditures.

According to the invention, this is accomplished by providing a variable filter whose bandwidth is selectively variable.

Surprisingly, the advantages of the invention are not only an improvement of the transmission behavior of FM stereo signals. It has been found that the discovered curve for the transmission characteristic permits the realization of many improvements in the characteristics of the ICS process in general. The adaptation of the passband characteristic in dependence on the signal conditions results in a significant improvement of reception under critical conditions.

Also defined is an advantageous embodiment and the features of an FM stereo receiver equipped with the filter arrangement according to the invention as well as an adjacent channel detection circuit.

The invention is based on the realization that the improvement connected with the ICS process can be utilized particularly favorably if, under critical reception situations, a switch is made to a more narrowband transmission characteristic. In spite of interference close to the useful signal, such interference is particularly effectively eliminated in that the retunable filters follow the useful modulation directly. Thus those interference signals can be effectively eliminated, whose effects would have been difficult to reduce with the use of the ICS process or bandwidth switching alone. Only the sum of the measures according to the invention reduces their effects to an extent that they can only be detected by special measuring equipment.

A particular advantage of the invention is that the change in the transmission characteristic results in an adaptation to the actual reception situation in such a way that the listing quality is hardly adversely influenced. In spite of a relatively dramatic effect on the reception quality particularly of noise sources in the vicinity of the useful signal, care is taken that—particularly in a mobile reception situation—no subjectively noticeable worsening of reception occurs. This success is of particular significance especially because suddenly occurring short loud noises spoil the listening pleasure for the entire program even if the great majority of the broadcast passages are of excellent broadcast quality.

DETAILED DESCRIPTION OF THE PREFERRED EMBODIMENT(S)

A preferred embodiment of a circuit for detecting adjacent channel interference constitutes an effective means for evaluating reception quality in order to automatically change the bandpass behavior as a function of the output signal of this circuit. In particular, the passband characteristic becomes more narrowbanded as soon as adjacent channel interference is detected.

Figure 1:
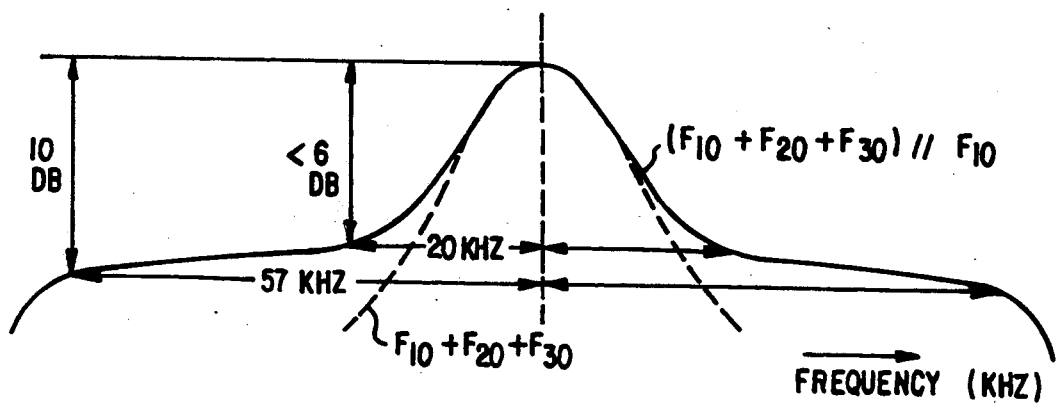
FIG. 1 is a diagram of a filter passband characteristic.
Figure 2:
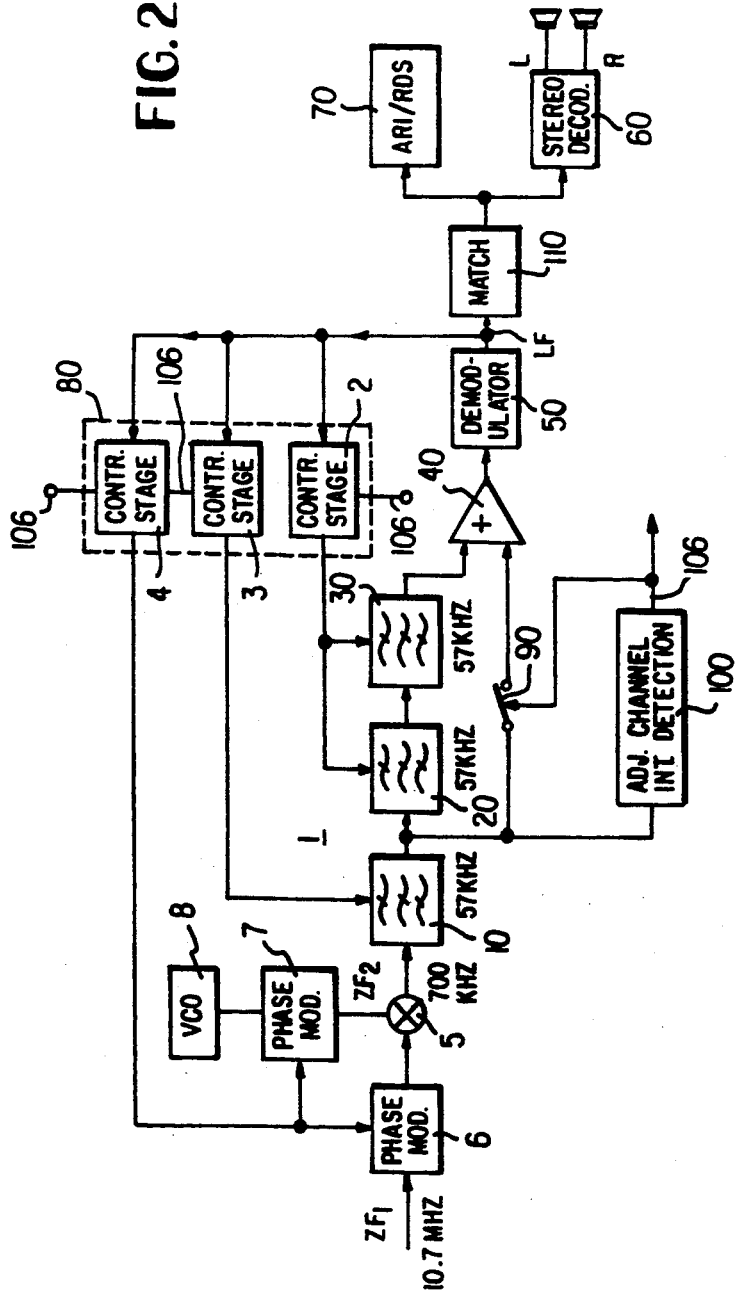
FIG. 2 is a block diagram of the major components of an embodiment of the invention.

The passband characteristic of FIG. 1, which will be discussed in greater detail below, relates to the transmission behavior of the FM stereo receiver according to the invention, an embodiment of which is shown in FIG. 2. The receiver is illustrated without preselector and mixer stages so that a standard IF signal $IF_1$ at a frequency of 10.7 MHz is present as input signal of the illustrated block circuit diagram.

An essential component of the block circuit according to FIG. 2 is the IF filter arrangement 1 according to the invention, which includes three series-arranged filter stages 10, 20 and 30 in a first, upper filter branch.

According to the MPX signal bandwidth of 57 kHz, filter stage 10, which determines the relatively level curve section of the filter passband characteristic according to FIG. 1 and through which pass the higher-frequency components of the MPX signal, has a bandwidth of ±57 kHz, that is approximately 100 kHz. In one favorable embodiment, filter 10 is not—as would correspond to the solidly drawn transmission behavior curve shown in FIG. 3 (also for the other filters)—a single-circuit filter but a two-terminal bandpass filter. The transmission characteristic of this filter, which is more level in this case, is marked $F_{10}$ in FIG. 3 and is shown in dashed lines. The bandwidths of filter stages 20 and 30 are dimensioned in such a manner that the bandwidth of the series circuit of filter stages 10, 20, 30 is approximately 20 kHz.

The MPX ("MPX"=multiplex) signal under consideration is primarily a currently used analog FM stereo radio signal. However, it is easily possible to process a digital FM stereo radio signal with the aid of this filter arrangement.

Connecting the three filter stages 10, 20, 30 in series results in the more narrowband frequency curve $F_{10}+F_{20}+F_{30}$ indicated partially in dashed lines in FIG. 1.

The narrow, steep-edged curve is superposed on the curve of passband characteristic $F_{10}$ resulting in the lower curve drawn as a solid line in FIG. 1. This superposition is effected by circuit means in which the output of first filter stage 10 is fed to an adder stage 40 in a second filter branch of filter arrangement 1. The adder stage is also connected to the output of the third filter stage 30. Advisably, adder stage 40 is a summing amplifier which amplifies the filtered IF signal to the required level needed for subsequent demodulation in a demodulator 50. A filter passband characteristic realized in this manner can also be achieved by other circuit means, for example by means of digital filters, without deviating from the concept of the invention.

The demodulated signal, designated by LF, at the output of demodulator 50 is subjected to a level and possibly phase correction by means of a correction stage 110 in order to equalize the different level and phase curves in the two filter branches, that is to say the curves of the two input signals of adder stage 40. The corrected LF signal, which includes all components of the MPX signal, is fed to a stereo decoder 60 and to a ARI/RDS stage 70.

Stereo decoder 60 generates from the L+R and the L−R components the stereophonic left (L) and right (R) informations which are fed to corresponding L and R channels, respectively. The ARI/RDS stage filters the modulated 57 kHz auxiliary carrier of the ARI and/or of the RDS signal out over a narrow band, demodulates it and (in the case of RDS) decodes the additional ARI and RDS signals and evaluates these additional signals. A control stage 80 generates from the LF signal (modulation) at the output of demodulator 50 a positive feedback control signal St which is fed to the control inputs of all filter stages. The additional ARI signal is understood to mean an Auto Radio Information in the form of a traffic station and region detection which is modulated in amplitude modulation onto the 57 kHz auxiliary carrier. The term additional RDS signal is understood to mean a Radio Data System information which is modulated in the form of a digital signal in 2 PSK modulation onto the 57 kHz auxiliary carrier in quadrature position in addition to or independent of the additional ARI signal. In addition to traffic station detection, the RDS information includes a station identification, a program type detection as well as alternate frequencies over which the same program as the tuned-in station is broadcast (see EBU Doc. Tech. 3244 published by the European Broadcasting Union).

Additionally, the LF signal is fed to control stage 80, before or after correction. In a manner to be described in greater detail below, control stage 80 retunes filter stages 10, 20 and 30 to the momentary IF in dependence on the modulation.

Figure 3:
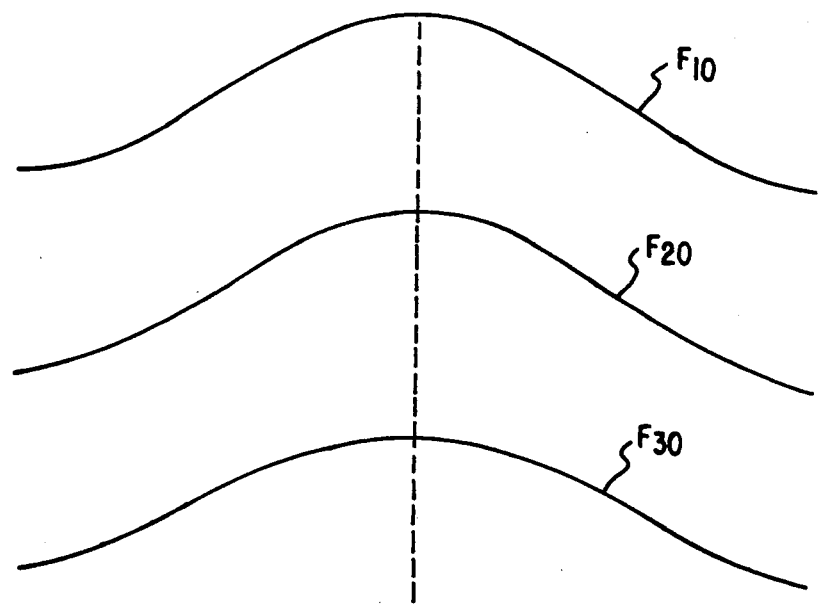
FIG. 3 is a diagram showing the transmission characteristics of three filters.

Initially, the bottom curve in FIG. 3 will be considered once more. The filter curve designated $2F_{10}+F_{20}+F_{30}$ in FIG. 3 exhibits, in the region of the center frequency $f_{IF}$ retuned to the momentary IF, a sharp drop in filtering of at least 6 dB with a width of approximately 20 kHz. As has already been mentioned, this sharp drop in filtering results from the series connection of filter stages 10, 20, and 30. When the passband of sum curve $F_{10}+F_{20}+F_{30}$ is superposed on the flat passband of curve $F_{10}$ in adder stage 4, the signal levels associated with the passband regions are adjusted in such a manner that the resultant passband of curve $2F_{10}+F_{20}+F_{30}$ is about 10 dB above the passband of curve $F_{10}$ at its point of resonance. This produces relatively level curve branches in a range which is symmetrically spaced from the middle of the channel ($=f_{IF}$) by about 38 kHz, adequate for effective noise and interference suppression of the L−R band in the MPX signal. The pass limits of the overall curve $(F_{10}+F_{20}+F_{30})/F_{10}$ are spaced about 57 kHz from the middle of the channel so that the auxiliary 57 kHz carrier in the MPX signal is also filtered effectively.

In the second filter branch of filter arrangement 1 (FIG. 2), an electronic switch 90 is provided which is controlled by a stage 100 for detecting adjacent-channel interference. In the illustrated example, stage 100 is fed from the output of the first filter stage and has a switching threshold above which a switching signal is supplied to switch 90. This is so because, if the adjacent channel interference exceeds a limit value, stereo reproduction is no longer meaningful. At that point, the mentioned superposition of the narrow, steep-edged curve $F_{10}+F_{20}+F_{30}$ (FIG. 3) on the flat curve $F_{10}$ is prevented and only the mentioned narrow, steep-edged curve becomes effective for filtering of the IF signal, but only for monophonic signal reproduction. The IF signal resulting in this case at the output of adder stage 40 exhibits a greater selectivity than in the case where switch 90 is closed, as a result of which the detected adjacent-channel interference is masked out and mono reception free of interference is ensured.

The mono/stereo switchover effected by switch 90 may make it possible to omit the presently customary mono/stereo changeover switch in stereo decoder 60.

Figure 5A:
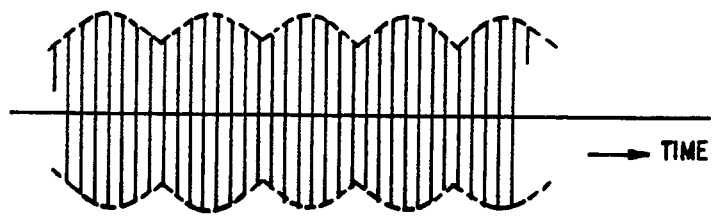
FIG. 5a is a diagram of the envelope of the output signal from filter stage 10.
Figure 5B:
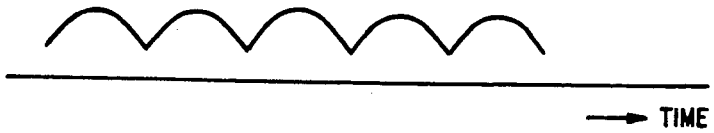
FIG. 5b is a diagram of the envelope with high-frequency components removed.
Figure 5C:
FIG. 5c is a diagram of the smoothed envelope.
Figure 5D:
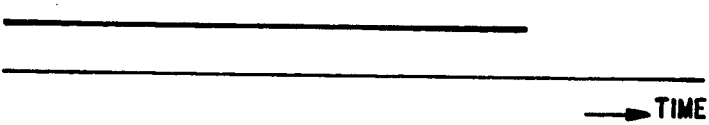
FIG. 5d is a diagram of the switching signal.
Figure 5E:
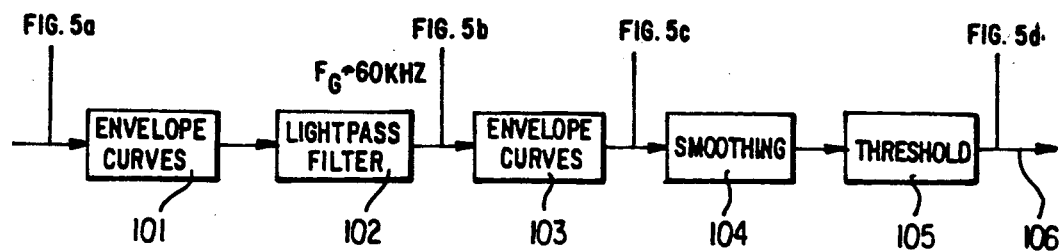
FIG. 5e is a block diagram of the adjacent channel interference detection circuit 100.

Stage 100, shown in greater detail in FIG. 5e, includes a series connection of
- a first envelope curve demodulator 101;
- a high-pass filter 102 having a cutoff frequency of about 60 kHz;
- a second envelope curve demodulator 103;
- a smoothing stage 104; and
- a threshold switching stage 105.

Envelope curve demodulator 101 is supplied with the output signal of the first filter stage 10, shown in FIG. 5a, which is amplitude modulated by interferences between useful and adjacent channel. The stronger the adjacent channel carrier, the greater is this amplitude modulation. Low frequency signal components originating from the useful modulation or higher frequency interference components are removed from the demodulated interference signal (FIG. 5b) at the output of envelope curve demodulator 101 by means of a high and/or lowpass filter 102. In the subsequent second envelope curve demodulator 103, the envelope curve (FIG. 5c), which is smoothed by means of stage 104 and compared in the threshold switching stage 105 with a predetermined reference level, is formed via the demodulated, highpass filtered interference signal. If the smoothed envelope curve signal exceeds the reference level, switching stage 105 generates at its output 106 the switching signal shown in FIG. 5d. As is indicated in FIG. 2 by the inputs of stages 2, 3 and 4 marked "106", this switching signal is supplied to control stages 2, 3 and 4 and also to the control input of switch 90. In the control stages 2 and 3, the switching signal causes the frequency components of the control voltages shown there to be slightly dropped, approximately above 6 kHz. In contrast, in control stage 4 for phase modulators 6, 7, the switching signal causes the frequency components of the control voltage generated there to be slightly raised, approximately above 5 kHz. These operations for influencing the frequency response are required because, due to the changed overall filter characteristic of the controlled IF filter stages 10, 20 30, the rate of phase change is increased which, without the mentioned frequency influencing, would lead to an increased interfering phase modulation in the higher frequency range above approximately 5 khz.

Figure 4:
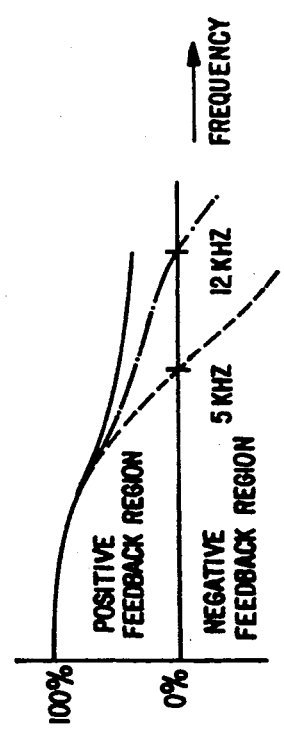
FIG. 4 is a diagram showing three different phase responses for the LF signal.

In the text which follows, the retuning of filter stages 10, 20 and 30 will be discussed in greater detail. For this purpose, three different phase responses of the LF signal at the output of the demodulator are shown in FIG. 4, the phase response achieved in accordance with the invention being indicated by a solid line. Due to the retuning of the filter stages by means of the LF signal or a control signal derived from it, a phase angle between the IF signal and the control signal occurs which rises with increasing LF signal frequency. Without the measures described below, this phase angle would become so large at about 5 kHz that the positive feedback which is effective up to that point (called the "area of positive phase relationship" in FIG. 4) becomes a negative feedback ("area of negative phase relationship").

Since the phase angle mentioned can be understood to be a phase modulation of the IF signal, the inventor [of the present invention] already had the idea (DE-OS 3,147,493) to subject the IF signal to an opposite phase modulation before filtering in filter stages 10, 20, 30. As can be seen from FIG. 2, a first retuning control signal for filter stages 20 and 30 is generated in a first control stage 2, and a second control signal for first filter stage 10 in a second control stage 3, so as to be active as phase modulator. With the aid of this phase modulation, the phase response with a zero point at 5 kHz, shown in dashed lines in FIG. 4, can be shifted in the direction toward higher frequencies (phase response drawn in dot-dashed lines), so that a zero point, i.e., a change from the desired area of positive phase relationship to the undesirable area of negative phase relationship occurs at about 12 kHz; thus, this measure cannot yet be satisfactory.

In the receiver according to FIG. 2, two further phase modulators 6 and 7 are provided which are jointly controlled by a third control stage 4. Phase modulator 6 is arranged ahead of a mixer stage 5 which converts the incoming standard IF signal $IF_1$ of 10.7 MHz into a second IF signal $IF_2$ of, for example, 700 kHz. For this purpose, a local oscillator 8 is used which is followed by the third phase modulator 7. The control signals of the control stages 2, 3 and 4 and the frequency responses of phase modulators 8, 7 and 10 are matched to one another in such a manner that the phase response, drawn in a solid line in FIG. 4, of the LF signal at the output of demodulator 50 is obtained, which remains in the region of positive phase relationship even at higher LF frequencies.

Using the invention, it is possible for the first time and in a surprising manner to receive an MPX signal with considerably increased sensitivity and to reproduce it in stereo down to about 8 $\mu V$ antenna input voltage. In this arrangement, filter expenditures are no greater than hitherto required for the purely mono solution.

I claim:

1. An FM receiver, for use in mobile reception, having a variable IF filter, the center frequency of the IF filter being returned in dependence on the modulation of a received signal, the bandwidth of the IF filter being selectively variable, the bandwidth being changed in response to an output signal from a signal reception quality circuit, wherein the signal output from the reception quality circuit is formed by an adjacent channel detection circuit, wherein the adjacent-channel detection circuit includes a series connection composed of the following stages:
   a first envelope curve demodulator to which is fed the output signal of a first filter stage of said IF filter amplitude modulated by interferences between a useful and an adjacent channel;
   at least one of a high and a low pass filter for separating the demodulated interference signal at the output of the first envelope curve demodulator from at least one of high and low frequency signal components;
   a second envelope curve demodulator which forms an envelope curve signal by way of the demodulated, filtered interference signal, with the level of the envelope curve being a measure for the level of the adjacent channel carrier; and
   a threshold switching stage which compares the envelope curve signal with a predetermined reference level and changes the bandwidth of the variable IF filter if the reference level is exceeded.

2. An FM receiver according to claim 1, wherein the output signal from the reception quality circuit causes the bandwidth of the IF filter to be switched to be more narrowbanded.

3. An FM receiver according to claim 1, wherein the variable IF filter includes at least two series-connected filter stages, the output signals of two filter stages combined to form a linked signal which covers a broader frequency range, said linked signal being fed to a subsequent demodulator stage.

4. An FM receiver according to claim 3, wherein at least one of the series-connected filter stages is a bandpass filter having a relatively broad bandwidth.

5. An FM receiver according to claim 3, wherein at least one of the series connected filter stages is a single circuit filter having a relatively narrow bandwidth.

6. An FM receiver according to claim 5, wherein the two series-connected single circuit filters are provided tuned to the same frequency.

7. An FM receiver according to claim 1, wherein a demodulator is provided connected to an output of the variable IF filter, the demodulator being connected to output a demodulated signal to a correction stage, the correction stage for equalizing differences in phase and levels in the demodulated signal resulting from different group delays and levels caused by filtering in the low frequency range.

8. An FM receiver according to claim 7, wherein first and second phase modulators are additively connected to an input to the variable IF filter and wherein the frequency response of a first control voltage derived from the demodulator for controlling the variable IF filter is controlled so that frequency components of the first control voltage above 6 kHz are lowered slightly, and further wherein the frequency response of a second control voltage derived from the demodulator for controlling the first and second phase modulators is controlled so that high frequency components of the second control voltage at about 5 kHz and above are raised slightly.

9. An FM receiver as claimed in claim 1, wherein the more narrowbanded bandwidth of the variable IF filter is approximately 20 kHz.

10. An FM receiver, comprising:
a variable IF filter, having at least one filter stage, the center frequency of the variable IF filter being retuned in dependence on a received signal;
means for selecting the passband of the variable IF filter so that the shape of the passband characteristic of the variable IF filter is changed depending on reception quality, said means for selecting including an adjacent channel detection circuit which produces a switching signal based on the reception quality; and
wherein said adjacent channel detection circuit includes the following stages connected in series:
a first envelope curve demodulator which receives an output signal from a first filter stage of said variable IF filter which signal may include amplitude components caused by interference between a useful and an adjacent channel, and outputs a demodulated interference signal;
at least one of a high and a low pass filter for separating the demodulated interference signal output from said first envelope curve demodulator from at least one of high and low frequency signal components, and outputs a demodulated, filtered interference signal;
a second envelope curve demodulator which forms an envelope curve signal from the demodulated, filtered interference signal, the level of the envelope curve signal depending on the level of the adjacent channel carrier; and
a threshold switching stage which compares the envelope curve signal from the second envelope curve demodulator with a predetermined reference level and if the reference level is exceeded emits the switching signal for changing the passband of the variable IF filter.

11. An FM receiver as claimed in claim 10, wherein when the reference level is exceeded, the passband of the variable IF filter is changed to be more narrowbanded.

* * * * *